(12) United States Patent
Ma et al.

(10) Patent No.: US 9,006,785 B2
(45) Date of Patent: Apr. 14, 2015

(54) DOPED AND STRAINED FLEXIBLE THIN-FILM TRANSISTORS

(71) Applicant: Wisconsin Alumni Research Foundation, Madison, WI (US)

(72) Inventors: Zhenqiang Ma, Middleton, WI (US); Jung-Hun Seo, Madison, WI (US); Max G. Lagally, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 31 days.

(21) Appl. No.: 13/751,477

(22) Filed: Jan. 28, 2013

(65) Prior Publication Data

US 2014/0209977 A1     Jul. 31, 2014

(51) Int. Cl.
*H01L 31/072* (2012.01)
*H01L 29/32* (2006.01)
*H01L 29/786* (2006.01)

(52) U.S. Cl.
CPC .............. *H01L 29/32* (2013.01); *H01L 29/786* (2013.01)

(58) Field of Classification Search
USPC ............ 257/190, 347, 74, 455–458, E29.085; 438/458.157, 479, 149
See application file for complete search history.

(56) References Cited

U.S. PATENT DOCUMENTS

| | | | |
|---|---|---|---|
| 7,229,901 B2 | 6/2007 | Savage et al. | |
| 7,354,809 B2 * | 4/2008 | Yuan et al. | 438/157 |
| 2009/0032842 A1 * | 2/2009 | Lagally et al. | 257/190 |

OTHER PUBLICATIONS

Yuan et al., High-speed strained-single-crystal-silicon thin-film transistors on flexible polymers, Journal of Applied Physics, vol. 100, No. 013708, Jul. 14, 2006.
Yuan et al., Microwave thin-film transistors using Si nanomembranes on flexible polymer substrate, Applied Physics Letters, vol. 89, No. 212105, Nov. 22, 2006.
Sun et al., 12-GHz Thin-Film Transistors on Transferrable Silicon Nanomembranes for High-Performance Flexible Electronics, Small, vol. 6, No. 22, Sep. 27, 2010, pp. 2553-2557.
Zhang et al., Fast flexible electronics using transferrable silicon nanomembranes, J. Phys. D: Appl. Phys., vol. 45, No. 143001, Mar. 23, 2012.
Zhou et al., Fast flexible electronics with strained silicon nanomembranes, Scientific Reports, vol. 3, No. 1291, Feb. 18, 2013.
Rogers et al., Synthesis, assembly and applications of semiconductor nanomembranes, Nature, vol. 477, Sep. 1, 2011, pp. 45-53.
Scott et al., Elastically strain-sharing nanomembranes: flexible and transferable strained silicon and silicon-germanium alloys, J. Phys. D: Appl. Phys., vol. 40, Feb. 2, 2007, pp. R75-R92.

(Continued)

*Primary Examiner* — Dung A. Le
(74) *Attorney, Agent, or Firm* — Bell & Manning, LLC (57) ABSTRACT

Semiconductor trilayer structures that are doped and strained are provided. Also provided are mechanically flexible transistors, including radiofrequency transistors, incorporating the trilayer structures and methods for fabricating the trilayer structures and transistors. The trilayer structures comprise a first layer of single-crystalline semiconductor material, a second layer of single-crystalline semiconductor material and a third layer of single-crystalline semiconductor material. In the structures, the second layer is in contact with and sandwiched between the first and third layers and the first layer is selectively doped to provide one or more doped regions in the layer.

8 Claims, 10 Drawing Sheets

(56) References Cited

OTHER PUBLICATIONS

Ahn et al., High-Speed Mechanically Flexible Single-Crystal Silicon Thin-Film Transistors on Plastic Substrates, IEEE Electron Device Letters, vol. 27, No. 6, Jun. 2006, pp. 460-462.

Zhu et al., Spin on dopants for high-performance single-crystal silicon transistors on flexible plastic substrates, Applied Physics Letters, vol. 86, No. 133507, Mar. 23, 2005.

Mooney et al., Strained Si-on-Insulator Fabricated from Elastically-Relaxed Si/SiGe Structures, Mat. Res. Soc. Symp. Proc., vol. 809, 2004, pp. B1.3.1-B1.3.6.

Menard et al., A printable form of silicon for high performance thin film transistors on plastic substrates, Applied Physics Letters, vol. 84, No. 26, Jun. 28, 2004, pp. 5398-5400.

Mooney et al., Elastic strain relaxation in free-standing SiGe/Si structures, Applied Physics Letters, vol. 84, No. 7, Feb. 16, 2004, pp. 1093-1095.

* cited by examiner

DOPED AND STRAINED FLEXIBLE THIN-FILM TRANSISTORS

REFERENCE TO GOVERNMENT RIGHTS

This invention was made with government support under FA9550-08-1-0337 awarded by the USAF/AFOSR. The government has certain rights in the invention.

BACKGROUND

Fast flexible electronics operating at radio frequencies (>1 GHz) are attractive because of their versatile capabilities, dramatic power savings when operating at reduced speed, and broad spectrum of applications, including applications in wireless and high-speed communications, remote sensing, and surveillance.

Transferrable single-crystalline Si nanomembranes (NMs) are useful materials for device layers in flexible electronics owing to their material uniformity, mechanical flexibility and durability, electrical properties, easy handling and processing, and low cost. While the carrier mobility of bulk Si can be enhanced using strain techniques, implementing these techniques into transferrable single-crystalline Si nanomembranes for fast flexible electronics has been challenging. In contrast to rigid devices fabricated from bulk Si, where strain in the active device layer can be easily sustained by a rigid substrate, the strain in free-standing transferrable Si nanomembranes needs to be self-sustained. A strain-sharing scheme between multiple epitaxial layers of Si and SiGe can self-sustain strain in transferrable nanomembrane structures and leads to enhanced electron mobility in Si. For truly high-speed device fabrication, however, doping of the Si nanomembrane is highly desirable. Unfortunately, the successful fabrication of doped, free-standing, strained Si nanomembranes has not yet been achieved.

SUMMARY

Semiconductor trilayer structures that are doped and strained are provided. Also provided are transistors that incorporate the trilayer structures and methods for fabricating the trilayer structures and transistors.

One embodiment of a doped and strained semiconductor trilayer structure comprises a first layer of single-crystalline semiconductor material, wherein the first layer is selectively doped to provide one or more doped regions extending through the first layer; a second layer of single-crystalline semiconductor material; and a third layer of single-crystalline semiconductor material, wherein the second layer is in contact with and sandwiched between the first and third layers, wherein the semiconductor material of the first and third layers is the same material and the thicknesses of the first and third layers are substantially equal, and further wherein the trilayer structure has self-sustained strain that is shared between the three layers.

One embodiment of a transistor comprises: (a) a strained trilayer structure comprising a first layer of single-crystalline semiconductor material, wherein the first layer is selectively doped to define a source region, a drain region and a gate region in the first layer; a second layer of single-crystalline semiconductor material; and a third layer of single-crystalline semiconductor material, wherein the second layer is in contact with and sandwiched between the first and third layers, wherein the semiconductor material of the first and third layers is the same material and the thicknesses of the first and third layers are substantially equal, and further wherein the trilayer structure has self-sustained strain that is shared between the three layers; (b) a substrate structure disposed below and in contact with the third layer of single-crystalline semiconductor material, wherein the substrate structure and the third layer of single-crystalline semiconductor material do not have an epitaxial relationship; (c) a gate dielectric disposed on the gate region in the first layer of single-crystalline semiconductor material; (d) a gate contact disposed over the gate dielectric; (e) a source contact in electrical communication with the source region in the first layer of single-crystalline semiconductor material; and (f) a drain contact in electrical communication with the drain region in the first layer of single-crystalline semiconductor material. The transistor may be mechanically flexible and may be a radiofrequency transistor.

In one variation of this embodiment, the first and third layers of single-crystalline semiconductor material are layers of single-crystalline silicon and the second layer of single-crystalline semiconductor material is a layer of single crystalline silicon SiGe alloy. In another variation, the first and third layers of single-crystalline semiconductor material are layers of single-crystalline SiGe alloy and the second layer of single-crystalline semiconductor material is a layer of single-crystalline silicon.

One embodiment of a method of fabricating a doped, strained trilayer structure comprises the steps of: (a) selectively doping a layer of single-crystalline semiconductor material to form one or more doped regions, wherein the layer of single-crystalline material is attached to a sacrificial substrate; (b) annealing the doped layer of single-crystalline semiconductor material, whereby damage to the single-crystalline structure caused by the doping is repaired; (c) thinning the doped and annealed layer of single-crystalline semiconductor material; (d) growing a second layer of single-crystalline semiconductor material on the thinned first layer, wherein the second layer is a strained layer; (e) growing a third layer of single-crystalline semiconductor material on the second layer of single-crystalline semiconductor material, wherein the semiconductor material of the first and third layers is the same material and the thicknesses of the first and third layers are substantially equal; and (f) releasing the trilayer structure from the sacrificial substrate, whereby the released trilayer structure has self-sustained strain that is shared between the three layers.

One embodiment of a method of fabricating a mechanically flexible transistor comprises the steps of: (a) forming the released trilayer structure according to the method recited above, wherein the one or more doped regions of the first layer of single-crystalline material define a source region, a drain region and a gate region in the first layer; (b) adhering the released trilayer structure to a mechanically flexible substrate structure disposed below and in contact with the third layer of single-crystalline semiconductor material; (c) forming a gate dielectric on the gate region in the first layer of single-crystalline semiconductor material of the released trilayer structure; (d) forming a gate contact over the gate dielectric; (e) forming a source contact in electrical communication with the source region in the first layer of single-crystalline semiconductor material; and (f) forming a drain contact in electrical communication with the drain region in the first layer of single-crystalline semiconductor material.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 5 shows the device DC and RF response characteristics of the unstrained and strained transistors of FIG. 4. (A) Transfer curves and calculated transconductance ($g_m$) curves of the unstrained and strained devices ($V_{ds}$=500 mV). (B) $g_m$ plotted as a function of drain current. Point A indicates the peak $g_m$ where peak $f_T/f_{max}$ were measured. Point B is where 3.5 GHz $f_{max}$ can be obtained. The drain current at point B is roughly two orders lower than that at point A. (C) Current gain ($H_{21}$) and power gain ($G_{max}$) as a function of frequency of unstrained and strained devices ($V_g$=4V, $V_{ds}$=5V). (D) and (E), $f_T$ and $f_{max}$ of strained devices as a function of gate bias under fixed drain bias ($V_{ds}$=5V) and that as a function of drain bias under fixed gate bias ($V_g$=4V), respectively.

FIG. 6(A) Calculated mobility values from measured transconductance as a function of bending induced strain for both unstrained and strained devices. (B) $f_T$ and $f_{max}$ of both unstrained and strained devices as a function of bending induced external strain.

DETAILED DESCRIPTION

Semiconductor trilayer structures that are doped and strained are provided. Also provided are mechanically flexible transistors, including radiofrequency (>1 GHz) transistors, incorporating the trilayer structures and methods for fabricating the trilayer structures and transistors.

The trilayer structures comprise a first layer of single-crystalline semiconductor material, a second layer of single-crystalline semiconductor material and a third layer of single-crystalline semiconductor material. In the structures, the second layer is in contact with and sandwiched between the first and third layers and the first layer is selectively doped to provide one or more doped regions in the layer. The layers of single-crystalline material and trilayer structures made therefrom are also referred to herein as "nanomembranes".

The trilayer structure is initially grown epitaxially on a sacrificial growth substrate from which it is subsequently released. However, prior to the growth of the second and third layers of the trilayer, the first layer is selectively doped. In the as-grown trilayer, the middle (second) layer of single-crystalline material accommodates all, or at least a substantially majority of, the strain in the trilayer. Upon release of the trilayer structure from the growth substrate, a portion of the strain (compressive or tensile, depending of the materials) borne by the second layer is transferred to the other two layers. Thus, it is desirable to have a balanced trilayer structure, in which the first and third layers are composed of the same material and the thicknesses of the first and third layers are substantially equal, in order to prevent or minimize curling or buckling of the heterostructure upon release from the growth substrate.

Because the released trilayer structure is no longer rigidly attached to a substrate with which it has an epitaxial relationship, strain is shared elastically between the three layers and, while the trilayer structure may subsequently be transferred to variety of substrate structures, the strain profile through the trilayer is independent, or substantially independent, of those substrate structures. For the purposes of this disclosure, trilayers having such a strain sharing relationship are referred to as having "self-sustained" strain.

The amount of strain transferred from the middle layer to the outer layers in the trilayer structure, will depend on the thickness ratios of those layers and on the material composition of the layers, which controls the mismatch strain ($\in_m$) in the trilayer. Generally, the magnitude of strain sharing between the layers will increase with increasing thickness of the second layer and decreasing thickness of the first and third layers. The thickness of the second layer, however, should be kept below the kinetic critical thickness for dislocation formation because, as noted above, in the as-grown state, that layer accommodates all, or a substantial majority of, the strain. (Note that the kinetic critical thickness is different from (i.e., larger than) the thermodynamic critical thickness, because of kinetic barriers to dislocation formation. As the growth temperature is lowered the kinetic critical thickness increases.)

Suitable semiconductor materials for use in the layers of the trilayer structures include Group IV semiconductors, such as silicon and germanium, and their alloys, such as SiGe alloys. However, other semiconductor materials, such as Group III-V, Group II-VI and alloys thereof can also be used. In some embodiments, the second layer in the trilayer structure is grown with a compressive strain, such that when the trilayer is released from its growth substrate, that strain is transferred to the first and third layers in the form of a tensile strain. A trilayer structure in which the second layer is a layer of single-crystalline SiGe alloy and the first and third layers are layers of single-crystalline Si (a "Si/SiGe/Si" structure) is an example of such an embodiment. In other embodiments, the second layer in the trilayer structure is grown with a tensile strain, such that when the trilayer is released from its growth substrate, that strain is transferred to the first and third layers in the form of a compressive strain. A trilayer structure in which the second layer is a layer of single-crystalline Si and the first and third layers are layers of single-crystalline SiGe alloy (a "SiGe/Si/SiGe" structure) is an example of such an embodiment.

Figure 1:
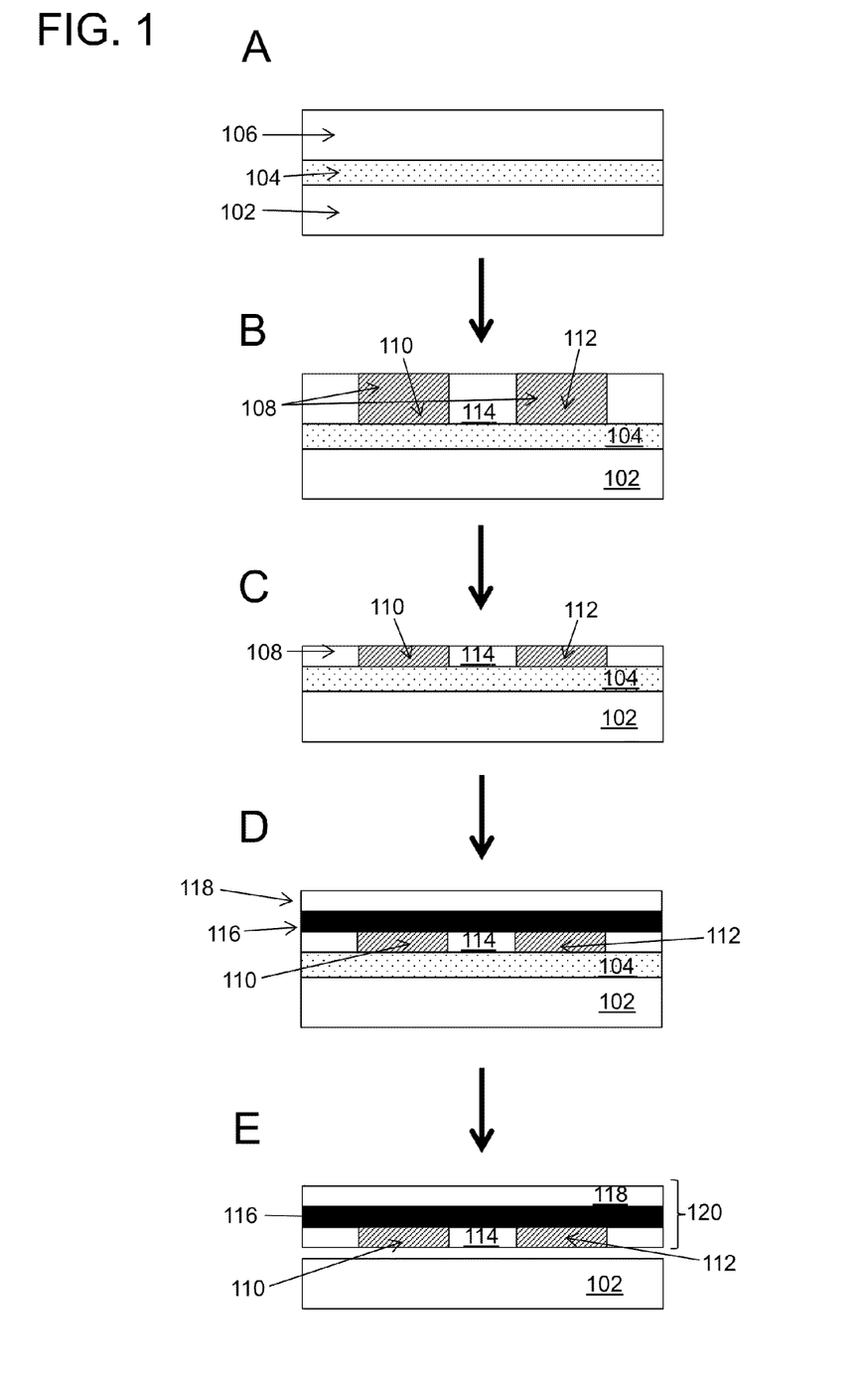
FIG. 1 is a schematic diagram of a process for fabricating a doped and strained thin-film transistor.

FIG. 1 is a schematic illustration of the process flow for the fabrication of a doped, strained trilayer structure and the subsequent fabrication of a transistor incorporating the trilayer structure. The trilayer structure is initially grown on a sacrificial growth substrate. As shown in panel (A) of FIG. 1, a semiconductor-on-insulator (e.g., a silicon-on-insulator; SOI) comprising a handle layer 102, a buried insulator layer 104 (i.e., the buried oxide or "BOX" layer in a conventional SOI), and a single-crystalline semiconductor device layer 106, may be used as a starting point. In the semiconductor-on-insulator structure, buried insulator layer 104 provides a sacrificial substrate and single-crystalline semiconductor device layer 106 provides the first layer of trilayer structure. Device layer 106 desirably starts out with a greater thickness than it will have in the finished product so that it can be thinned after it is selectively doped. This is advantageous because it allows the subsequent dopant implantation to be carried out without damaging the lowermost portion of device layer 106.

As shown in panel (B) selective doping followed by an anneal can be used to form one or more doped regions 108 extending through (i.e., form one side to the other) first layer of single-crystalline material 106. (As used herein, the phrase "selective doping" refers to a doping process in which only portions of the layer are dopes, while other portions remain undoped and unaffected by the doping process. Thus, a characteristic of a selectively doped layer is that it will have a non-uniform dopant profile across its width, wherein the width dimension is taken to be perpendicular to the height—or thickness dimension of the layer.) Selective doping can be achieved using ion implantation with masking to provide a desired doping pattern. In the embodiment of FIG. 1, doped regions 108 provide a source region 110 and a drain region 112 for a transistor. A gate region 114 is defined between source and drain regions 110, 112. Depending on the materials used for the various layers in the trilayer structure, the dopants may be n-type dopants or p-type dopants. For example in the Si/SiGe/Si trilayer structure, n-type dopants can be used to form n-type doped source and drain regions in the first layer. In the SiGe/Si/SiGe trilayer structure, p-type dopants can be used to form p-type doped source and drain regions in the first layer. During the ion implantation, the crystalline structure of the bottom portion of single-crystalline semiconductor layer 106 should be left undamaged so that it can serve as the seed layer for the subsequent re-crystallization of the material.

Following the ion implantation, an anneal is used to re-crystallize those portions of layer 106 that were damaged by the implantation and to drive the dopants to diffuse through the thickness of the layer to provide a substantially uniform dopant concentration through the thickness of layer 106 within doped regions 108.

Once the doped regions have been formed, single-crystalline semiconductor layer 106 can be thinned to its desired thickness (panel (C)). Thinning of this layer is advantageous because it allows for increased strain sharing in the trilayer structure. Thinning may be carried out using a thermal oxidation or other controlled etching processes. In addition, a chemical mechanical polish (CMP) may be employed. The latter approach has the advantage of providing a smooth surface without excessive heating which could affect the dopant distribution in the layer.

Next, as shown in panel (D), a second layer of single-crystalline material 116 is grown as a strained layer on single-crystalline layer 106 and a third layer of single-crystalline semiconductor material 118 is grown on layer 116.

Sacrificial layer 104 is then selectively removed (e.g., using a selective etch) to release trilayer structure 120 (panel (E)), whereby strain is transferred from layer 116 to layers 106 and 118 to provide a trilayer with self-sustained strain. Released trilayer structure 120, which has come to rest on handle layer 102 can then be transferred to another substrate structure 122, as illustrated in panel (F). As shown here, the substrate may include an support layer 124, the surface of which is coated with a film of adhesive material 126. When adhesive film 126 is contacted with the upper surface of the third layer 118 of trilayer structure 120, the trilayer structure becomes adhered to substrate structure 122 and can be lifted off handle layer 102 and flipped (panel (G)) to provide the new substrate structure. Support layer 124 is desirably thin enough to be mechanically flexible and may be a plastic material. As used herein, the term plastic material refers to a material that is composed primarily of synthetic and/or natural organic resins and/or polymers. Polyethylene terephthalate (PET) is an example of a plastic material that can be used as support layer 124.

Now source and drain contacts 128 and 130 are deposited over the newly-exposed surface of the first layer of single-crystalline material 106, by, for example, depositing a metal, such as gold. This is illustrated in panel (H) of FIG. 1. Finally, a layer of gate dielectric material 132 and a gate contact 134 are formed over gate region 114 to provide a gate stack, as shown in panel (I).

The trilayer structures and transistors can have large areas, but remain sufficiently thin to be mechanically flexible. For example, in some embodiments the trilayer structures have a thickness of no greater than about 1000 nm. This includes embodiments in which the trilayer structures have a thickness of no greater than about 600 nm and embodiments in which the trilayer structures have a thickness of no greater than about 300 nm. Trilayer structures having thicknesses within these ranges can be made by limiting the thicknesses of the layers of single-crystalline semiconductor material to no greater than about 300 nm, no greater than about 200 nm or no greater than about 100 nm. Similarly, the transistors incorporating the trilayer structures can be very thin. For example, in some embodiments, the transistor has a thickness, as measured from the lower surface of its substrate structure to the upper surface of its highest contact, of no greater than about 2 μm. This includes embodiments in which the transistor has a thickness of no greater than about 1000 nm and further includes embodiments in which the transistor has a thickness of no greater than about 500 nm.

The mechanically flexible trilayer structures and transistors can be flexed (e.g., bent and even rolled into cylinders) without experiencing a significant decrease in their performance. For the purposes of this disclosure, a decrease in performance would be considered significant if it rendered the transistor inoperable for its primary function. For example, in some embodiments the performance properties (e.g., speed of operation, carrier mobility, etc.) of the mechanically flexible transistors in a flexed state differ by no more than 10% from their performance properties in an unflexed (e.g., planar) state. This includes embodiments in which the performance properties of the mechanically flexible transistors in a flexed state differs by no more than 5%, or even no more than 1%, from the performance properties of the transistors in their unflexed state. In fact, because strain in the trilayer can be increased by bending the transistors, the performance of the transistors may even improve upon flexing.

Some embodiments of the mechanically flexible transistors can be flexed into a curve with a convex bending radius of 20 mm or smaller without experiencing a significant decrease in their performance. This includes embodiments in which the transistors can be flexed into curve with a convex bending radius of 15 mm or smaller, or even 10 mm or smaller, without experiencing a significant decrease in their performance.

EXAMPLE

This example illustrates a method for fabricating a mechanically flexible thin film transistor comprising a doped and strained trilayer structure. The impetus for the development of the process flow described here was that, surprisingly, when the strained trilayer structures were doped prior to release, using the doping approach that has been successfully applied to unstrained Si nanomembranes (NMs), the strained NM curled upon release and became very rough. (For an example of previous methods used to dope unstrained silicon nanomembrane (SiNM), see Yuan, H.-C. & Ma, Z., Microwave thin-film transistors using Si nanomembranes on flexible polymer substrate, Applied Physics Letters 89, 212105 (2006); and Sun, L. et al., Flexible electronics: 12-GHz Thin-Film Transistors on Transferrable Silicon Nanomembranes for High-Performance Flexible Electronics, *Small* 6, 2473 (2010).) A 3D microscopic image of a doped and annealed trilayer Si/SiGe/Si NM after release from a handling substrate showed that the topology of the released trilayer NM was unsuitable for further processing, such as transfer and patterning. The Si/SiGe/Si epilayer structure may have been damaged through atomic mixing and crystalline defects created by the implanted ions. If so, the subsequent annealing procedure intended for re-crystallization failed to restore the ion-implanted, damaged layers and interfaces back to their original order. Instead, significant and unbalanced stress was built in the trilayer NM after performing the doping processes, which caused severe curling upon the release.

To realize effective doping while maintaining a flat topology of the flexible, strain-shared trilayer NM for fabrication of RF devices, the alternative approach to strain-compatible effective doping processes of the present disclosure was developed. Instead of applying the ion implantation and anneal processes directly on a trilayer NM, these processes were applied to an unstrained Si template (device) layer of an SOI prior to the growth of the rest of the trilayer. Low-energy phosphorus ion implantation was used to heavily dope the top portion of the Si template layer of the SOI, leaving the bottom portion barely damaged by the implanted ions. An annealing process followed to re-crystallize the damage and simultaneously drive the implanted dopants to diffuse until they reached the bottom surface of the template layer, generating a high-level and nearly uniform doping profile across the entire thickness of the Si template layer. Leaving the bottom portion of the template layer undamaged during implantation was advantageous, as the bottom portion served as the seed layer for re-crystallization of the entire layer during the annealing process.

A detailed description of the methods used to fabricate and characterize the performance of the transistors follows.

Materials and Methods

Doping of Unstrained Si Nanomembrane.

A SiNM was doped to reduce contact resistance in the source and drain regions of RF transistors. A commercially available SOI (Soitec USA, 2 Centennial Drive, Peabody, Mass. 01960, USA) substrate with 200 nm Si (001) template and 145 nm buried oxide (BOX) layers was used as the starting material. The as-received Si (001) template was lightly doped with boron. Phosphorus ion implantation was used on the SOI substrate with a dose of $2 \times 10^{15}$ cm$^{-2}$ and an energy of 20 keV. Following the ion implantation, the sample was annealed in a high-temperature furnace at 950° C. for 30 minutes in $N_2$ ambient to re-crystallize the Si template and activate the dopants. TEM cross section images of the SiNM (unstrained) before and after annealing were obtained. The simulated and characterized doping profiles using secondary ion mass spectroscopy (SIMS) before and after anneal were also obtained.

Thinning down Si nanomembrane. After the ion implantation, the Si template layer was treated in an RIE chamber (Unaxis 790, 30 W) with $SF_6/O_2$ for 40 sec. A dry thermal oxidation at 1050° C. for 10 min was applied to the sample to further reduce the Si template to the desired thickness in the Si/SiGe/Si trilayer structure. The final thickness of the Si template was 48 nm, as verified by x-ray diffraction (XRD) measurement.

For comparison, a selectively-doped, Si template layer was released and transferred to a flexible substrate (as described below). This released single-layer NM was used to form a comparative unstrained device.

Epitaxial Growth of SiGe/Si Layers.

Figure 2:
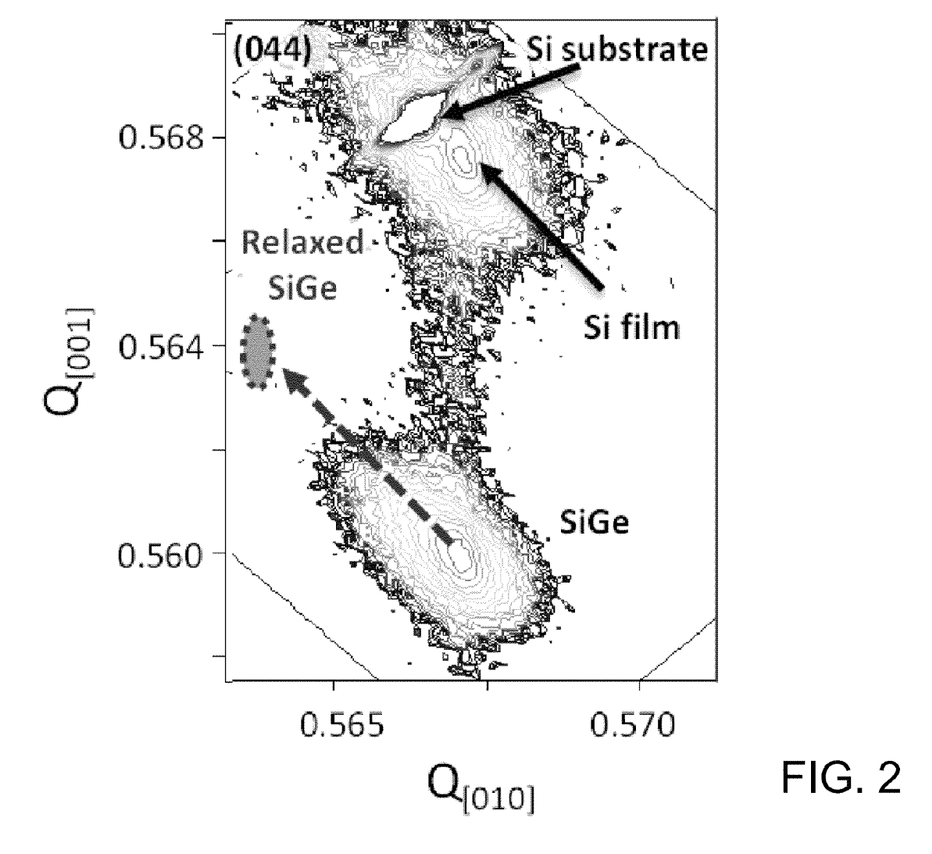
FIG. 2 shows the x-ray diffraction of an as-grown ion-implanted strained trilayer structure—off-axis reciprocal-space map (RSM) around the (044) reflection.

Si/SiGe/Si trilayer NM fabrication started with molecular beam epitaxy (MBE) growth of thin SiGe alloy films on the doped and annealed Si template layers of the SOI(001) substrates. The chemical cleaning procedure before growth on Si was as follows: [1] 20 sec. in 10% HF, [2] 10 min. in Piranha clean (~80° C. $H_2SO_4+H_2O_2$ solution), [3] 15 min. in standard clean 1 [SC1] (~80° C. $H_2O+NH_4OH+H_2O_2$ solution), and [4] 20 sec. in 10% HF (with a 5-min. (DI) water rinse between each step) before putting the sample directly into the high-vacuum growth chamber. The substrate was resistively heated to 475° C. during pseudomorphic growth of the alloy and a growth rate ~3 nm/min. was used. θ/2θ lines scans around the (004) reflection were fit to a simulation to extract the Ge composition of the SiGe layer and each of the layer thicknesses before release from the initial growth substrate: 46 nm Si/80 nm $Si_{0.795}Ge_{0.205}$/48 nm Si (FIG. 2). In the as-grown heterostructure, the main peak at lower Bragg angles was from the SiGe layer and the broad peak modulated by the thickness fringes was from the two Si layers.

Strain Calculation of Si in Si/SiGe/Si.

The Ge composition will determine the mismatch strain, and the thickness ratio controls the fractional amount of that mismatch strain that is transferred to the Si layers. The strain transferred to the Si layers is:

$$\varepsilon_{Si} = -\frac{1}{1 + \frac{M_{Si} \cdot t_{Si}}{M_{SiGe} \cdot t_{SiGe}}} \cdot \varepsilon_m,$$

where $M_i$ is the biaxial modulus and $t_i$ is the thickness of the respective layers. The mismatch strain, $\varepsilon_m$, is the amount of strain in the SiGe before release from the handling substrate.

$$\varepsilon_m = \frac{a_{Si} - a_{SiGe}}{a_{SiGe}},$$

$$a_{SiGe} = [5.431 + 0.2x + 0.027x^2] \text{Å}$$

Device Fabrication.

After the trilayer growth (for the strained-channel device) and ion implantation (for the untrained-channel reference device), optical photolithography was used to pattern both types of the active layers into 40 μm wide strips, with 10 μm gaps between them, etched using reactive ion etching (RIE). The photoresist on top was removed in acetone and the strips were released in a 4:1 diluted HF (49% HF) solution in which the BOX layer was selectively etched away. The strips fell onto the Si substrate and, during release, the trilayer Si/SiGe/Si structure shared strain elastically, leaving the top and bottom Si layers tensilely strained. Photoresist SU8-2002 (Microchem Corp.) was spun on the PET host substrate and the free-standing, elastically relaxed strips were transferred top side down onto the SU8 layer. To create better adhesion between the strips and SU8 layer, the Si substrate on which the strips had come to rest after release was gently pressed and then peeled off. The PET substrate was cured from the back side under UV light and baked at 105° C. for 5 min. After this step, the strips were firmly attached to the PET substrate and ready for the subsequent processing. The color difference between doped source/drain regions and channel regions helped alignment of gate patterns. To make the gate dielectric and gate metal contact, 120 nm thick SiO, 20 nm thick Ti and 150 nm Au were evaporated on the channel areas defined by optical photolithography. The source/drain metal consisting of 20 nm Ti and 300 nm Au was formed on both types of the active layers by optical photolithography and liftoff.

DC and RF Characterizations of Devices.

DC characteristics were measured with an Agilent 4155 semiconductor parameter analyzer in a dark environment. For RF characteristics, scattering (S) parameter measurement was taken using an Agilent E8364A network analyzer. The "open" and "short" features were used for a de-embedding procedure to obtain the intrinsic RF characteristics of device. The de-embedding procedure follows the equation; $Y_{transistor} = [(Y_{DUT} - Y_{open})^{-1} - (Y_{short} - Y_{open})^{-1}]^{-1}$. The effects of contact resistance $f_{max}$ can be seen in the following equations:

$$f_T = \frac{g_m}{2\pi(C_{gs} + C_{gd})},$$

$$f_{max} = \frac{f_T}{2\sqrt{(R_g + R_s) \cdot g_o + 2\pi \cdot R_g \cdot C_{gd} \cdot f_T}}$$

where $g_m$ is transconductance, $C_{gd}$ and $C_{gs}$ are gate-drain and gate-to-source capacitance, respectively. $g_o$ is output conductance. $R_g$ and $R_s$ are gate resistance and source resistance, respectively.

Power Savings when Operating a Device at Reduced Speed.

The relationship between power consumption (estimated based on drain current only, which is conservative) and $f_{max}$ can be estimated as described below. (See, Voinigescu, S. & Dickson, T. *High-Frequency Integrated Circuits* (Cambridge Univ. Press, New York, available in 2013)).

Transconductance can be calculated from the following equations:

$$I_D = \frac{1}{2} \cdot \mu \cdot C_{OX} \cdot \frac{W}{L} \cdot (V_{GS} - V_{th})^2$$

$$g_m = \frac{dI_D}{dV_{GS}} = k \cdot (V_{GS} - V_{th})$$

$$g_m \propto (V_{GS} - V_{th})$$

where $$I_D = I_0 \cdot \left(\frac{q}{nkT}\right) \cdot \exp\left(\frac{q(V_{GS} - V_{th})}{nkT}\right)$$

$$\log(I_D) = k' + \frac{q(V_{GS} - V_{th})}{nkT}$$

Log(h) is proportional to $g_m$ as follows:

$$\log(I_D) \approx (V_{GS} - V_{th}) \propto g_m.$$

Therefore the relationship between $g_m$ and the RF response is as follows:

$$f_T = \frac{g_m}{2\pi(C_{gs} + C_{gd})} \rightarrow f_T \propto \log(I_D)$$

and $$f_{max} = \frac{f_T}{2\sqrt{(R_g + R_s) \cdot g_o + 2\pi \cdot R_g \cdot C_{gd} \cdot f_T}}$$

$$\approx \frac{f_T}{2\sqrt{(R_g + R_s) \cdot g_o}} \rightarrow f_{max} \propto \log(I_D).$$

Thus, an estimate of power consumption at lower fmax values can be obtained by plotting $g_m$ versus log ($I_D$).

Results

Figure 3:
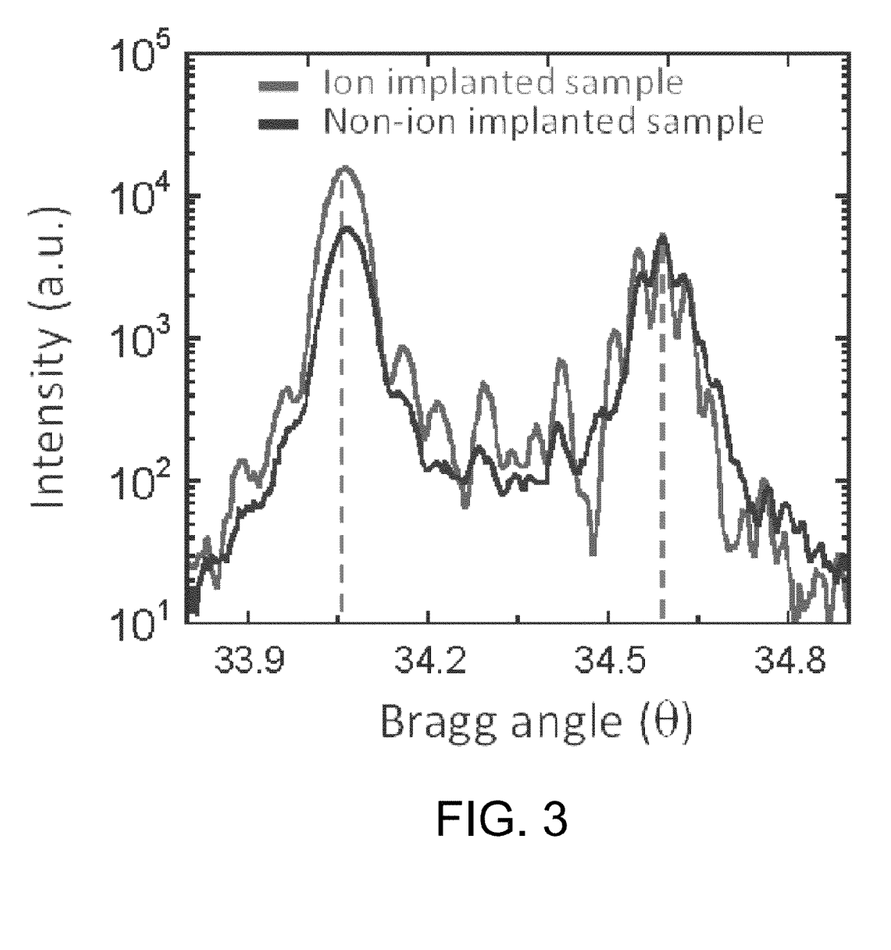
FIG. 3 shows the x-ray diffraction of an as-grown ion-implanted strained trilayer structure—on-axis line scans around the (004) reflection comparing the doped and undoped as-grown trilayer structures.

Images of the trilayer NMs (in the form of strips) at the different stages of processing showed doped regions for the source/drain/source, with 1.5 μm gaps between them (a two gate finger device). After finishing the growth, only the bottom Si layer was heavily and selectively doped, with few dopants diffusing back to the SiGe or to the top Si layers. The doping and thinning down procedures had some effect on the crystallinity of the as-grown Si/SiGe/Si trilayers (as indicated by a general broadening of the diffraction peaks in the on-axis line scans around the (004) reflection, shown in FIG. 3.) The SiGe layer, however, was still strained to the Si lattice constant so strain sharing was expected to occur as predicted upon release of these trilayers ($\epsilon_{Si}$=0.34%±0.01%). With this amount of biaxial tensile strain in Si, a ~47% increase in the electron mobility was expected.

Figure 4A:
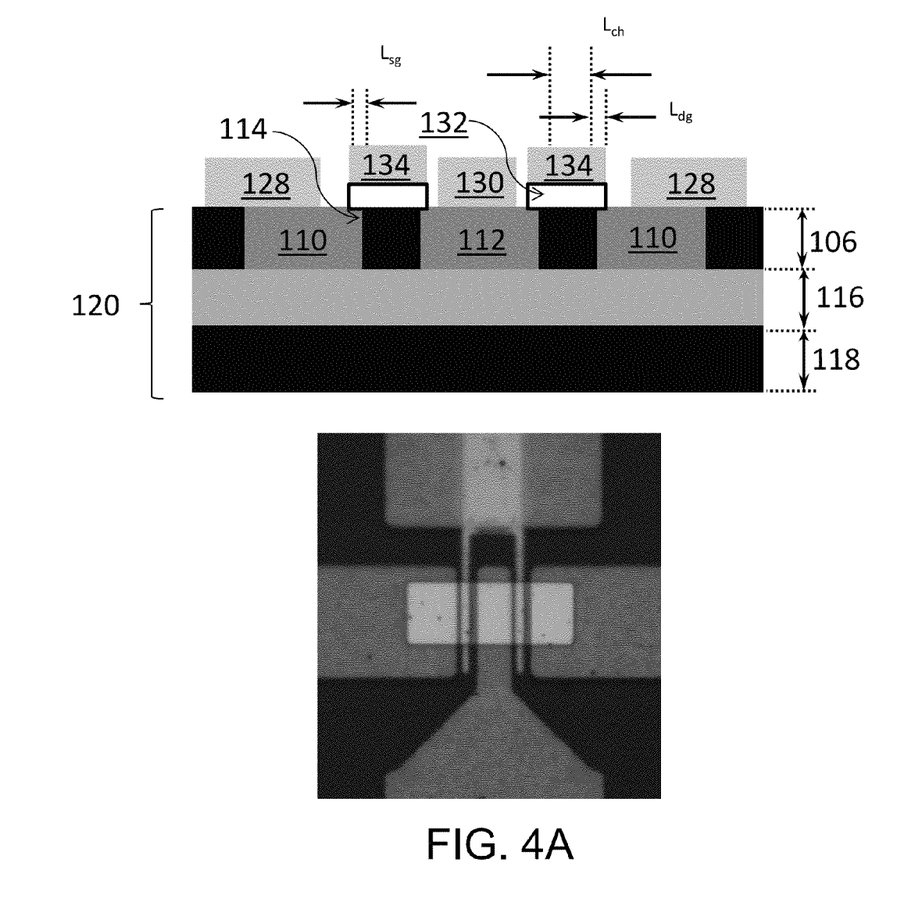
FIG. 4A (upper panel) is a cross sectional illustration of a transistor comprising a strained Si/SiGe/Si trilayer and (lower panel) an optical image of the fabricated strained device.
Figure 4B:
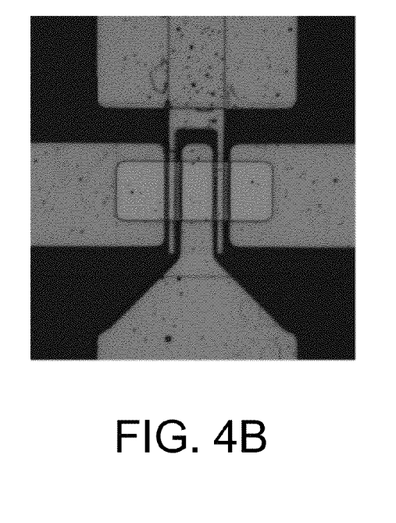
FIG. 4B (upper panel) is a cross sectional illustration of a transistor comprising an unstrained Si single layer and (lower panel) an optical image of the fabricated unstrained device. For both strained and unstrained devices, the gate lengths $L_g = L_{ch} + L_{sg} + L_{dg}$ are 2.5 μm and gate widths are 40 μm. Having a gate overlap distance with source/drain regions ($L_{sg}$ and $L_{dg}$) of 0.5 μm, the effective channel lengths ($L_{ch}$) are 1.5 μm.

FIGS. 4A and 4B show the cross sections (upper panels) and optical images (lower panels) of a finished Si/SiGe/Si trilayered, strained device on a PET substrate and a finished single Si NM, unstrained reference device on a PET substrate, respectively. The gate length and channel lengths, which were identically applied to both the strained and the unstrained NM, were 2.5 and 1.5 μm, respectively. The reference numbering scheme from FIG. 1 was adopted to label the corresponding transistor elements in FIG. 4.

Figure 5A:
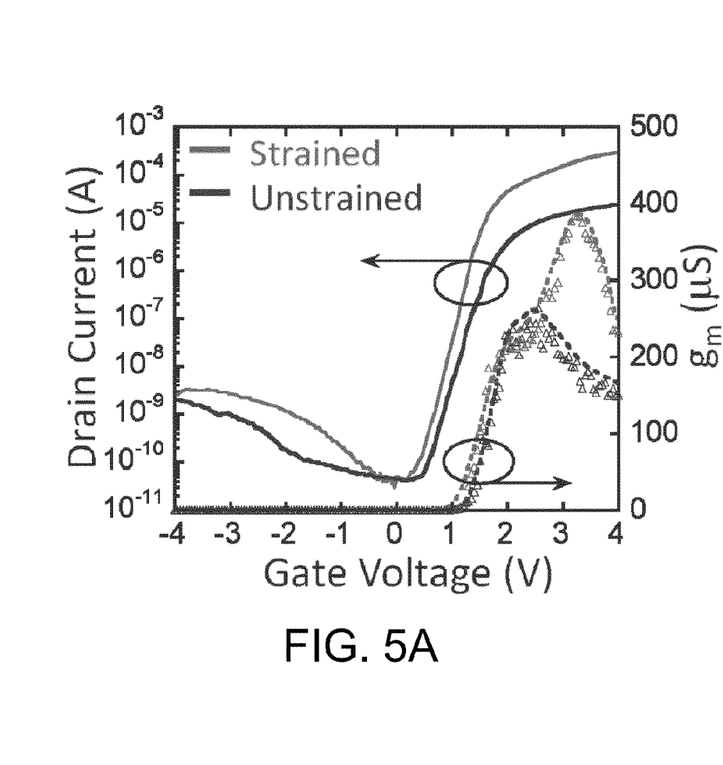
Figure 5B:
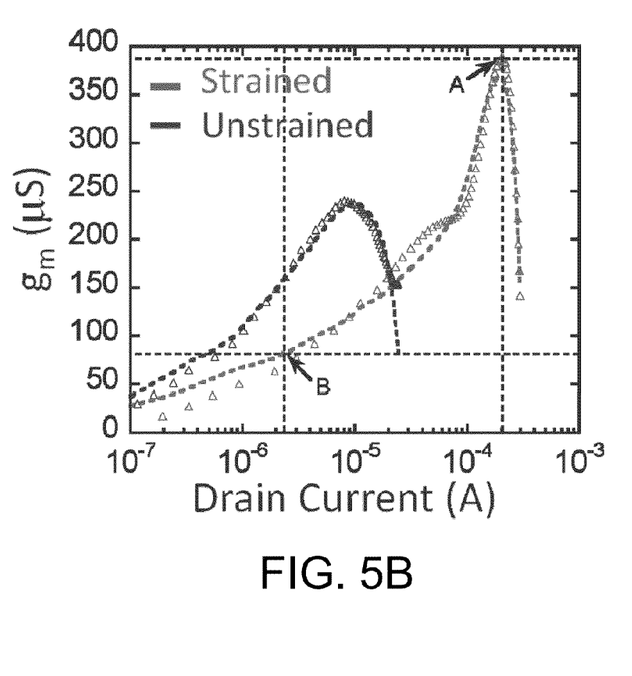
Figure 5C:
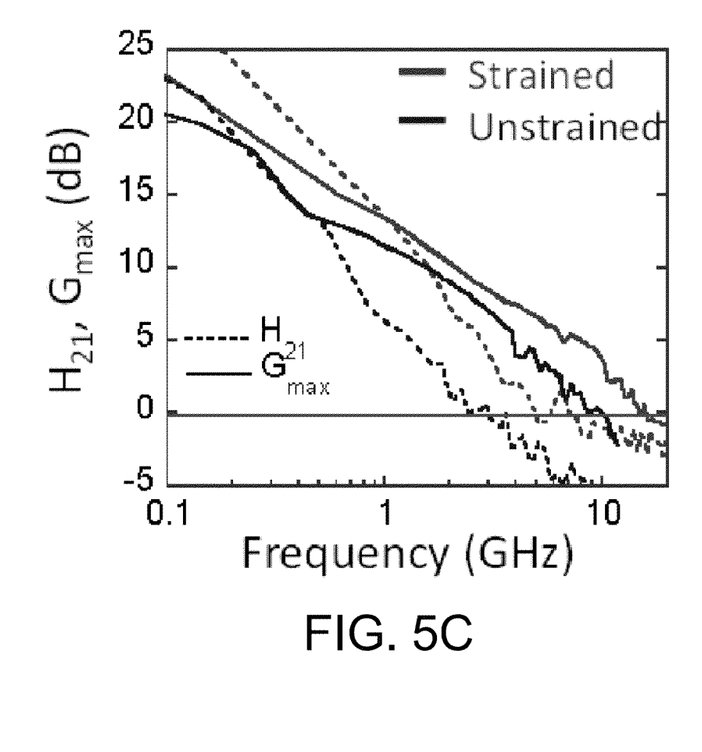
Figure 5D:
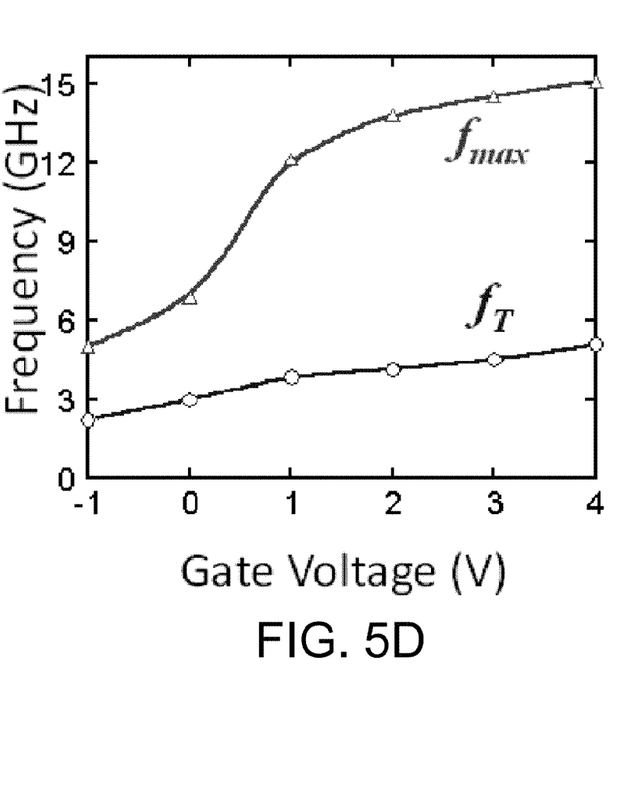
Figure 5E:
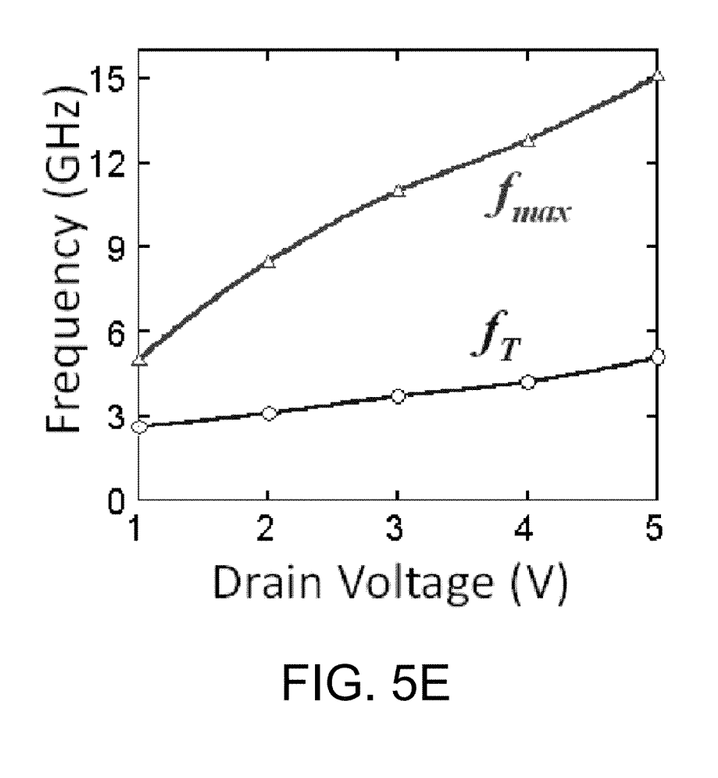

FIG. 5A shows the transfer curve and calculated transconductance ($g_m$) versus gate voltage ($V_g$) of a strained-channel TFT along with the results measured from the unstrained-channel TFT for comparison. The highest $g_m$ for the strained and the unstrained TFTs were 386 μS and 262 μS, respectively. Because the dimensions of the two devices were identical, the 47.3% enhancement of the peak $g_m$ values in the strained TFT was mainly ascribed to mobility enhancement, which is due to the introduction of the tensile strain in the Si channel of the trilayer. FIG. 5B plots the $g_m$ versus drain current. The roughly linear trend of $g_m$ as a function of logarithmic drain current is consistent with devices made on rigid substrates. FIG. 5C shows the measured current gain ($H_{21}$) and power gain ($G_{max}$) of the strained TFT, indicating that the cut-off frequency ($f_T$) was 5.1 GHz and the maximum oscillation frequency ($f_{max}$) was 15.1 GHz. For RF applications (analog circuits), power gain is more significant than current gain, which is typically used for evaluating switching speed of (digital/logic) devices. As a result, $f_{max}$ is considered a better indicator of the device's speed than $f_T$. The $f_{max}$ value sets a new speed record on Si based TFTs fabricated on plastic substrates, even though critical dimensions of the strained channel are larger than the previously reported devices and a relatively thick gate dielectric (120 nm) was used. Considering biomedical wireless devices typically operating at 400 MHz, for which both the strained-channel transistor (this work, on plastic) and poly-Si transistors (on glass) having a $f_{max}$ of 3.5 GHz can be used, the strained transistor consumes roughly two orders less power than the poly-Si transistor, as indicated by points A and B in FIG. 5B. As a comparison, the unstrained reference TFT with identical dimensions had $f_T$ and $f_{max}$ of 3.3 GHz and 10.3 GHz, respectively. The mobility enhancement (47.3%) was directly reflected in the device's speed enhancement: 54.5% for $f_T$ and 46.6% for $f_{max}$. Following the typical scaling law of field effect transistors, if a smaller device feature is applied to the strained-channel devices by using a previously demonstrated alignment scheme, about 6 GHz $f_T$ and 18 GHz $f_{max}$ can be expected. FIGS. 5D and E show the gate bias dependence under fixed drain bias and drain bias dependence under fixed gate bias of the frequency response characteristics of the strained channel TFT, respectively. Overall, relatively low bias voltages and, thus, low power consumptions were needed to operate these high-speed flexible transistors, a significant advantage of the single-crystal NM based TFTs over the polycrystalline Si-based TFTs, where much higher operation voltages are generally needed.

Figure 6:
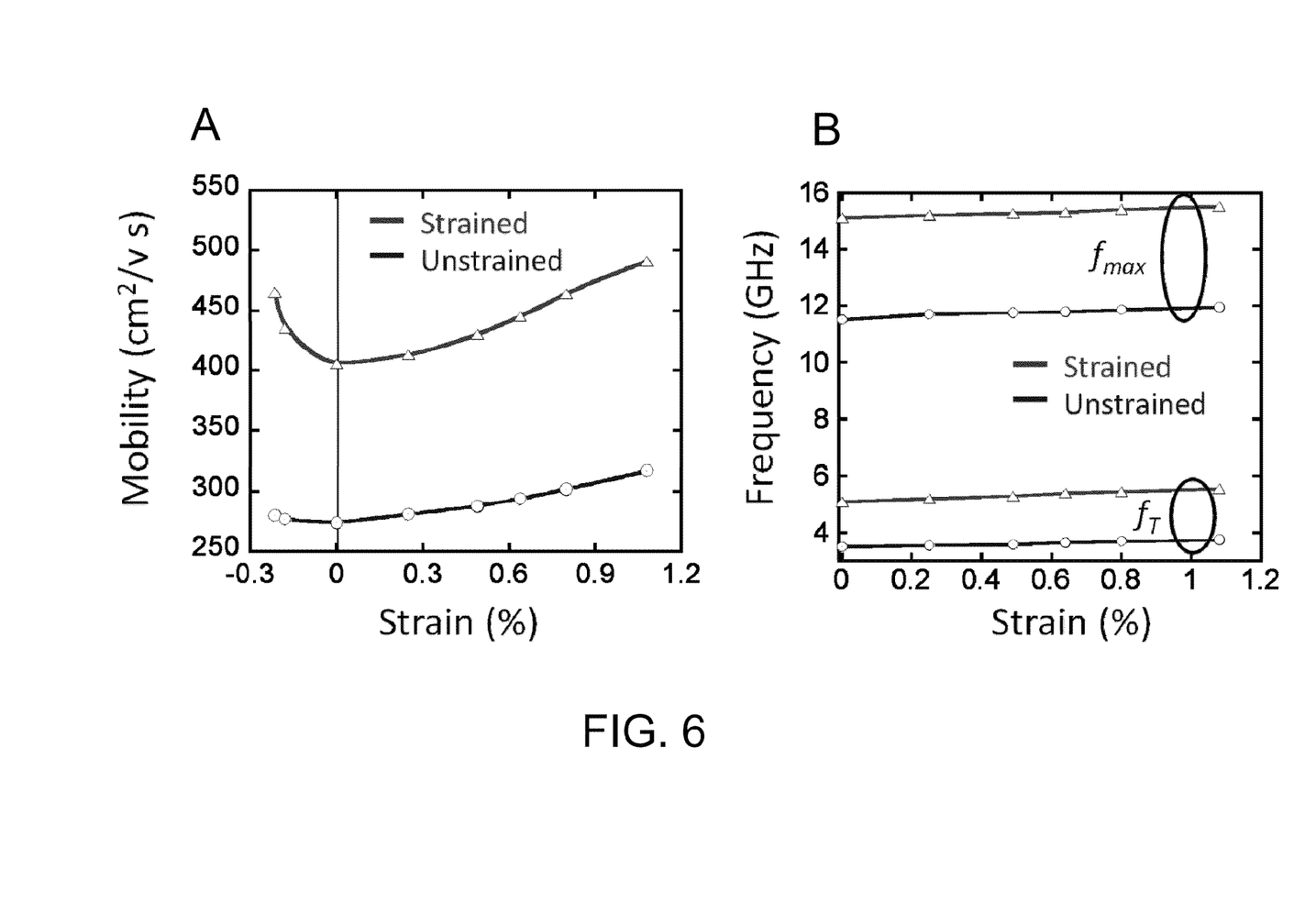

FIG. 6 shows the mobility and RF characteristics of the strained and the unstrained transistors under bending situations. Besides the effective mobility enhancement of 47.3% without applying any external strain, the mobility in both the strained and the unstrained transistor channels was further enhanced, 20% and 14.8%, respectively, by applying external uniaxial strain of 1.08% (measured from bending curvature). A mobility enhancement (13%) was also observed from the strained channel under a uniaxial externally applied compressive strain of −0.215%, indicating the possibility to create a complementary strain-shared structure: SiGe/Si/SiGe for higher-performance flexible transistors, where SiGe serves as the device channel. The transistors remained intact and operational under high-strain conditions; a convex radius of curvature of 15.5 mm translates into an external strain of 1.08%.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A transistor comprising:
  a doped and strained trilayer structure comprising:
    a first layer of single-crystalline semiconductor material, wherein the first layer comprises one or more doped regions extending through the first layer and the one or more doped regions define a source region, a drain region and a gate region in the first layer;
    a second layer of single-crystalline semiconductor material; and
    a third layer of single-crystalline semiconductor material;
    wherein the second layer is in contact with and sandwiched between the first and third layers, wherein the semiconductor material of the first and third layers is the same material and the thicknesses of the first and third layers are substantially equal, and further wherein the trilayer structure is not attached to a substrate with which it has an epitaxial relationship, such that the trilayered structure has self-sustained strain that is shared between the three layers, and further wherein the trilayer structure has a flat topology;
  a mechanically flexible substrate structure disposed below and in contact with the third layer of single-crystalline semiconductor material, wherein the substrate structure and the third layer of single-crystalline semiconductor material do not have an epitaxial relationship;
  a gate dielectric disposed on the gate region in the first layer of single-crystalline semiconductor material;
  a gate contact disposed over the gate dielectric;
  a source contact in electrical communication with the source region in the first layer of single-crystalline semiconductor material; and
  a drain contact in electrical communication with the drain region in the first layer of single-crystalline semiconductor material.

2. The transistor of claim 1, wherein the transistor is a radiofrequency transistor.

3. The transistor of claim 1, wherein the mechanically flexible substrate comprises a layer of plastic material.

4. The transistor of claim 1, wherein the first and third layers of single-crystalline semiconductor material are layers of single-crystalline silicon and the second layer of single-crystalline semiconductor material is a layer of single crystalline silicon SiGe alloy.

5. The transistor of claim 4, wherein the transistor is a radiofrequency transistor.

6. The transistor of claim 1, wherein the first and third layers of single-crystalline semiconductor material are layers of single-crystalline SiGe alloy and the second layer of single-crystalline semiconductor material is a layer of single-crystalline silicon.

7. The transistor of claim 6, wherein the transistor is a radiofrequency transistor.

8. A method of fabricating the transistor of claim 1, the method comprising:
  selectively doping a layer of single-crystalline semiconductor material to form one or more doped regions, wherein the one or more doped regions define a source region, a drain region and a gate region in the layer of single-crystalline semiconductor material and the layer of single-crystalline material is attached to a sacrificial substrate;
  annealing the doped layer of single-crystalline semiconductor material, whereby damage to the single-crystalline structure caused by the doping is repaired;
  thinning the doped and annealed layer of single-crystalline semiconductor material;
  growing a second layer of single-crystalline semiconductor material on the thinned first layer, wherein the second layer is a strained layer;
  growing a third layer of single-crystalline semiconductor material on the second layer of single-crystalline semiconductor material, wherein the semiconductor material of the first and third layers is the same material and the thicknesses of the first and third layers are substantially equal; and
  releasing the trilayer structure from the sacrificial substrate, whereby the released trilayer structure has self-sustained strain that is shared between the three layers;

adhering the released trilayer structure to a mechanically flexible substrate structure disposed below and in contact with the third layer of single-crystalline semiconductor material;

forming a gate dielectric on the gate region in the first layer of single-crystalline semiconductor material of the released trilayer structure;

forming a gate contact over the gate dielectric;

forming a source contact in electrical communication with the source region in the first layer of single-crystalline semiconductor material; and forming a drain contact in electrical communication with the drain region in the first layer of single-crystalline semiconductor material.

* * * * *